(12) United States Patent
Kim

(10) Patent No.: US 10,205,118 B2
(45) Date of Patent: Feb. 12, 2019

(54) DISPLAY DEVICE HAVING TOUCH SENSING PART

(71) Applicant: Samsung Display Co., Ltd., Yongin-Si, Gyeonggi-Do (KR)

(72) Inventor: Tae Kon Kim, Yongin-si (KR)

(73) Assignee: Samsung Display Co., Ltd. (KR)

( * ) Notice: Subject to any disclaimer, the term of this patent is extended or adjusted under 35 U.S.C. 154(b) by 4 days.

(21) Appl. No.: 15/604,180

(22) Filed: May 24, 2017

(65) Prior Publication Data
US 2017/0358769 A1    Dec. 14, 2017

(30) Foreign Application Priority Data

Jun. 10, 2016    (KR) .................. 10-2016-0072302

(51) Int. Cl.
| | | |
|---|---|---|
| *H01L 51/52* | (2006.01) | |
| *H01L 27/32* | (2006.01) | |
| *G06F 3/041* | (2006.01) | |
| *H01L 51/56* | (2006.01) | |

(52) U.S. Cl.
CPC .......... *H01L 51/524* (2013.01); *G06F 3/0412* (2013.01); *H01L 27/323* (2013.01); *H01L 27/3262* (2013.01); *H01L 27/3276* (2013.01); *H01L 51/5253* (2013.01); *H01L 51/5203* (2013.01); *H01L 51/5246* (2013.01); *H01L 51/56* (2013.01)

(58) Field of Classification Search
CPC .................................................... H01L 51/524
See application file for complete search history.

(56) References Cited

U.S. PATENT DOCUMENTS

| 8,531,415 | B2 | 9/2013 | Kwak et al. | |
|---|---|---|---|---|
| 8,808,877 | B2 | 8/2014 | Terao | |
| 9,362,531 | B2 | 6/2016 | Hong | |
| 2014/0014960 | A1* | 1/2014 | Yamazaki | G06F 3/0412 257/59 |
| 2014/0117316 | A1 | 5/2014 | Choi | |
| 2015/0115234 | A1* | 4/2015 | Hong | H01L 51/525 257/40 |

(Continued)

FOREIGN PATENT DOCUMENTS

| EP | 3051589 A1 | 3/2016 |
|---|---|---|
| KR | 10-1082294 B1 | 11/2011 |

(Continued)

*Primary Examiner* — Victoria K Hall
(74) *Attorney, Agent, or Firm* — Innovation Counsel LLP

(57) ABSTRACT

A display device includes: a first substrate including a first region, a third region spaced apart from and surrounding the first region, and a second region located between the first region and the third region; a second substrate opposite to the first substrate; a display element including a first electrode on the first substrate, a light emitting layer provided on the first electrode, and a second electrode provided on the light emitting layer; a touch sensing part disposed on the second substrate; and a sealing member provided on the third region of the first substrate, the sealing member joining the first substrate and the second substrate, wherein the second electrode overlaps the touch sensing part, and an end of the second electrode is spaced apart from an end of the touch sensing part in the direction of the sealing member in the second region.

12 Claims, 13 Drawing Sheets

(56) References Cited

U.S. PATENT DOCUMENTS

| | | |
|---|---|---|
| 2015/0162387 A1 | 6/2015 | Gu et al. |
| 2015/0243711 A1 | 8/2015 | Hong et al. |
| 2015/0263309 A1 | 9/2015 | Hong |
| 2015/0351168 A1 | 12/2015 | Yasumoto et al. |

FOREIGN PATENT DOCUMENTS

| | | |
|---|---|---|
| KR | 10-2012-0068746 A | 6/2012 |
| KR | 10-2015-0043136 A | 4/2015 |
| KR | 10-2015-0099641 A | 9/2015 |
| KR | 10-2015-0114010 A | 10/2015 |

* cited by examiner

DISPLAY DEVICE HAVING TOUCH SENSING PART

RELATED APPLICATIONS

The present application claims priority to Korean Patent Application No. 10-2016-0072302 filed on Jun. 10, 2016 in the Korean Intellectual Property Office, the entire disclosure of which is incorporated by reference herein.

BACKGROUND

1. Field

An aspect of the present disclosure relates generally to display devices. More specifically, aspects of the present disclosure relate to display devices having reduced defects, and methods of their manufacture.

2. Description of the Related Art

Various display devices capable of displaying information have been developed. Such display devices include a liquid crystal display device, a plasma display panel device, an electrophoretic display device, an organic light emitting display device, and the like.

In general, manufacture of a display device involves a sealing process joining two opposing substrates using a sealing member. In the sealing process, the sealing member may be heated by a laser beam and then cured. In this case, the laser beam may be transferred to a conductive layer disposed in the vicinity of the sealing member through light reflection, etc. However, when transferred to the conductive layer, the laser beam may inadvertently be directed upon a display element electrically connected to the conductive layer, and therefore, a defect of the display element may be caused.

Accordingly, studies have been conducted to minimize defects in the display device.

SUMMARY

Embodiments provide a display device and methods of its fabrication, which can improve the reliability of a display element.

According to an aspect of the present disclosure, there is provided a display device including: a first substrate including a first region, a third region spaced apart from and surrounding the first region, and a second region located between the first region and the third region; a second substrate opposite to the first substrate; a display element including a first electrode provided on the first substrate, a light emitting layer provided on the first electrode, and a second electrode provided on the light emitting layer; a touch sensing part disposed on the second substrate; and a sealing member provided on the third region of the first substrate, the sealing member joining the first substrate and the second substrate, wherein the second electrode overlaps with the touch sensing part when viewed on a plane, and an end of the second electrode is spaced apart from an end of the touch sensing part at a certain distance in the direction of the sealing member in the second region.

The end of the second electrode may be disposed closer to the first region of the first substrate than the end of the touch sensing part.

The second electrode may be disposed on the first region and the second region, and may not overlap the sealing member.

The touch sensing part may be disposed in the first region and the second region, and may not overlap with the sealing member.

The second region may include a non-overlapping portion at which the second electrode and the touch sensing part do not overlap each other.

The width of the non-overlapping portion may be 80 μm or more.

The end of the second electrode may be disposed closer to the sealing member than the end of the touch sensing part.

The second electrode may be disposed at portions of the first region, the second region, and the third region, and partially overlap with the sealing member in the third region when viewed on a plane.

The end of the second electrode may extend to a lower surface of the sealing member.

The touch sensing part may include touch sensing electrodes that are provided on the second substrate and sense a touch, and connection lines connected to the touch sensing electrodes.

The touch sensing electrodes may be disposed in a region corresponding to the first region of the first substrate on the second substrate, and the connection lines may be disposed in a region corresponding to any one of the second and third regions of the first substrate on the second substrate.

The display device may further include a protective film provided on the touch sensing part.

The first substrate may further include at least one thin film transistor connected to the display element to drive the display element.

The thin film transistor may include an active pattern provided on the first substrate; a gate electrode provided on the active pattern with a gate insulating layer interposed therebetween; and source and drain electrodes each connected to the active pattern. Any one of the source and drain electrodes may be electrically connected to the first electrode.

According to an aspect of the present disclosure, there is provided a display device including: a first substrate including a first region in which an image is displayed, a second region provided at the periphery of the first region, and a third region provided at the periphery of the second region; a second substrate provided on the first substrate; a plurality of pixels displaying the image, the plurality of pixels each including at least one thin film transistor and a light emitting device connected to the thin film transistor; a touch sensing part provided on the second substrate; and a sealing member provided in the third region, the sealing member joining the first substrate and the second substrate, wherein the light emitting device includes a first electrode provided on the first substrate, a light emitting layer provided on the first electrode, and a second electrode provided on the light emitting layer, wherein the second electrode overlaps with the touch sensing part when viewed on a plane, and an end of the second electrode is spaced apart from an end of the touch sensing part at a certain distance in the direction of the sealing member in the second region.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout. The various figures are not necessarily to scale.

DETAILED DESCRIPTION

Figure 1:
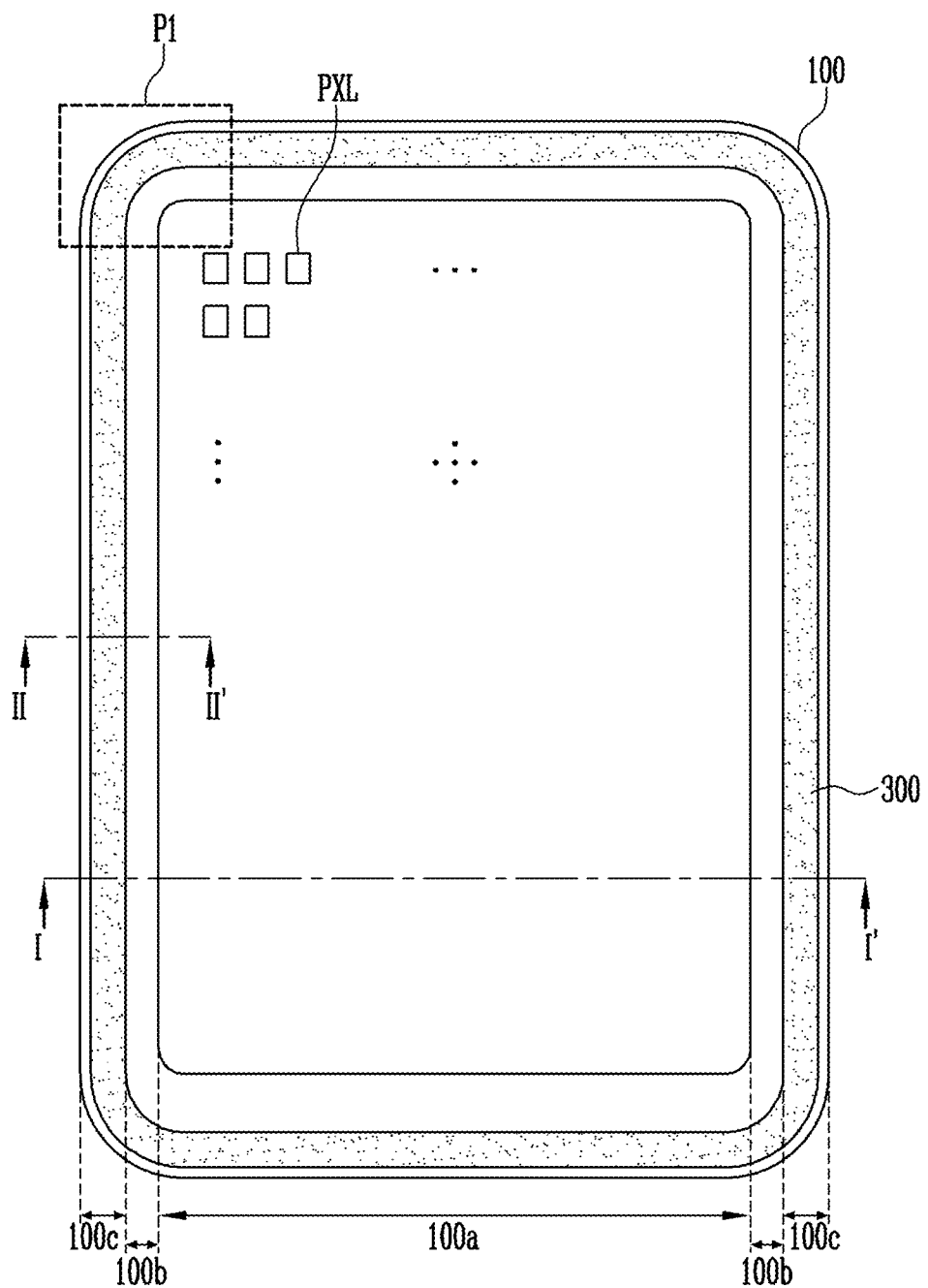
FIG. 1 is a plan view schematically illustrating a display device according to a first embodiment of the present disclosure.

The present disclosure may apply various changes and different shapes, and therefore only illustrates particular examples. However, the examples are not limited to these certain shapes or configurations. Any other shapes, materials, or the like are contemplated.

Like numbers refer to like elements throughout. In the drawings, the thickness of certain lines, layers, components, elements or features may be exaggerated for clarity. It will be understood that, although the terms "first", "second", etc. may be used herein to describe various elements, these elements should not be limited by these terms. These terms are only used to distinguish one element from another element. Thus, a "first" element discussed below could also be termed a "second" element without departing from the teachings of the present disclosure. As used herein, the singular forms are intended to include the plural forms as well, unless the context clearly indicates otherwise.

It will be further understood that the terms "includes" and/or "including", when used in this specification, specify the presence of stated features, integers, steps, operations, elements, and/or components, but do not preclude the presence and/or addition of one or more other features, integers, steps, operations, elements, components, and/or groups thereof. Further, an expression that an element such as a layer, region, substrate or plate is placed "on" or "above" another element indicates not only a case where the element is placed "directly on" or "just above" the other element but also a case where a further element is interposed between the element and the other element. On the contrary, an expression that an element such as a layer, region, substrate or plate is placed "beneath" or "below" another element indicates not only a case where the element is placed "directly beneath" or "just below" the other element but also a case where a further element is interposed between the element and the other element. All numerical values are approximate, and may vary. All examples of specific materials and compositions are to be taken as nonlimiting and exemplary only. Other suitable materials and compositions may be used instead.

Hereinafter, exemplary embodiments of the present disclosure will be described in detail with reference to the accompanying drawings.

Figure 2:
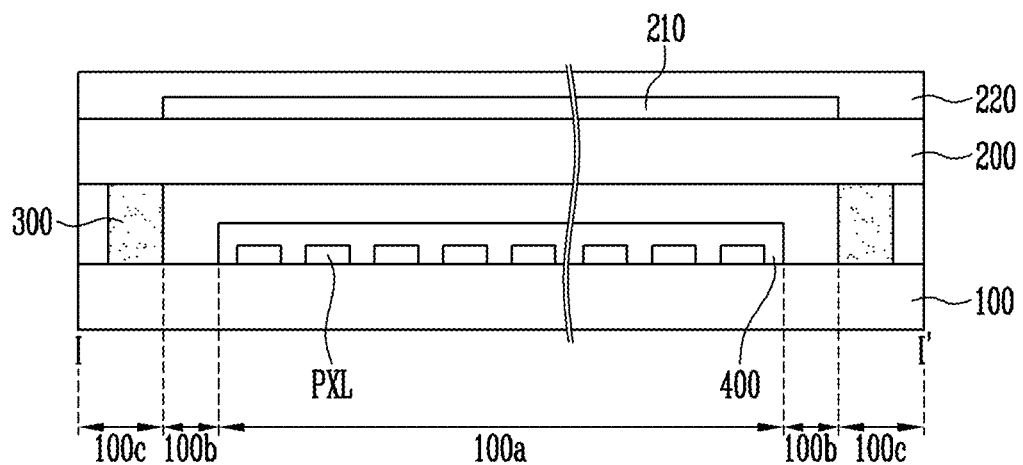
FIG. 2 is a sectional view taken along line I-I' of FIG. 1.

FIG. 1 is a plan view schematically illustrating a display device according to a first embodiment of the present disclosure. FIG. 2 is a sectional view taken along line I-I' of FIG. 1.

Referring to FIGS. 1 and 2, the display device according to the first embodiment of the present disclosure includes first to third regions 100a to 100c.

The first region 100a is a display region that includes a plurality of pixels PXL to display an image. The image may include arbitrary visual information, e.g., text, video, pictures, two-dimensional or three-dimensional images, and the like. The first region 100a is located at a central portion of the display device, and has a relatively large area as compared with the second region 100b and the third region 100c.

The second region 100b is a region in which lines for supplying an electrical signal to the pixels PXL are arranged, and may be disposed between the first region 100a and the third region 100c.

The third region 100c may be a cell sealing region in which a sealing member 300 for sealing the plurality of pixels PXL provided in the first region 100a is disposed. The third region 100c may be spaced apart from the first region 100a at a certain distance. The third region 100c may entirely surround the first region 100a. Here, the second region 100b and the third region 100c may be non-display regions in which the image is not displayed.

In addition, the display device includes a first substrate 100, a second substrate 200, an encapsulation layer 400 provided between the first substrate 100 and the second substrate 200, and the sealing member 300.

The first substrate 100 and the second substrate 200 may be provided in various shapes.

In an embodiment of the present disclosure, the second substrate 200 may be provided to have a smaller area than the first substrate 100, but the present disclosure is not limited thereto. For example, the second substrate 200 may be provided to have the same area as the first substrate 100.

The first substrate 100 is positioned opposite to the second substrate 200, and displays an image.

The first substrate 100 includes the pixels PXL provided thereon, and the encapsulation layer 400 covering the pixels PXL.

The first substrate 100 may be made of an insulating material having flexibility. The first substrate 100 may be made of various materials, e.g., glass, polymer metal, and the like. Particularly, the first substrate 100 may be an insulating substrate made of a polymer organic material. The material of the insulating substrate, including the polymer organic material, includes polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, cellulose acetate propionate, and the like. However, the material constituting the first substrate 100 is not limited thereto. For example, the first substrate 100 may be made of fiber glass reinforced plastic (FRP).

Each pixel PXL is provided on the first region 100a of the first substrate 100. The pixel PXL is a minimum unit for displaying an image, and may be provided in plural numbers. The pixel PXL may include an organic light emitting element that emits white light and/or colored light. The pixel PXL may emit light of any one color among red, green, and blue, but the present disclosure is not limited thereto. For example, the pixel PXL may emit light of a color such as cyan, magenta, or yellow. Any color or colors are contemplated.

The encapsulation layer 400 is provided on the first substrate 100 to cover the pixels PXL. The encapsulation layer 400 may be formed in a single layer, but may also be formed in multiple layers.

The second substrate 200 includes a touch sensing part 210 provided thereon, and a protective film 220 provided over the touch sensing part 210.

The second substrate 200 is provided corresponding to the shape of the first substrate 100. The second substrate 200 may have a shape approximately similar to that of the first substrate 100.

The touch sensing part 210 is disposed on the second substrate 200 to recognize a touch event to the display device through a user's hand or separate input means. The touch sensing part 210 includes sensing electrodes to sense a touch and/or a pressure, and the particular type of touch sensing part 210 is not limited. For example, the touch sensing part may be implemented as capacitive type sensors, pressure resistive type sensors, and the like. The capacitive type sensor can be a mutual capacitance type sensor in which a change in capacitance generated by an interaction between two sensing electrodes is sensed, or can be a self-capacitance type sensor in which a change in capacitance of a sensing electrode itself is sensed.

The protective film 220 is disposed over the touch sensing part 210 to planarize step differences in elevation of the touch sensing part 210 disposed thereunder. Also, the protective film 220 prevents oxygen and moisture from being introduced into the touch sensing part 210 from the outside. The protective film 220 may be configured in the form of a film in which an inorganic material having a single- or multi-layered structure is coated on an organic material, but the present disclosure is not limited thereto.

Figure 3:
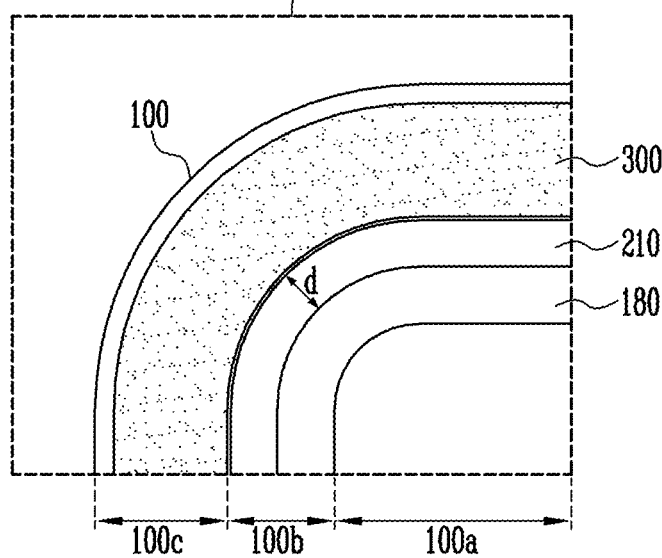
FIG. 3 is a plan view conceptually illustrating a portion corresponding to section P1 of FIG. 1, which illustrates an arrangement relationship among a sealing member, a touch sensing part, and a second electrode.
Figure 4:
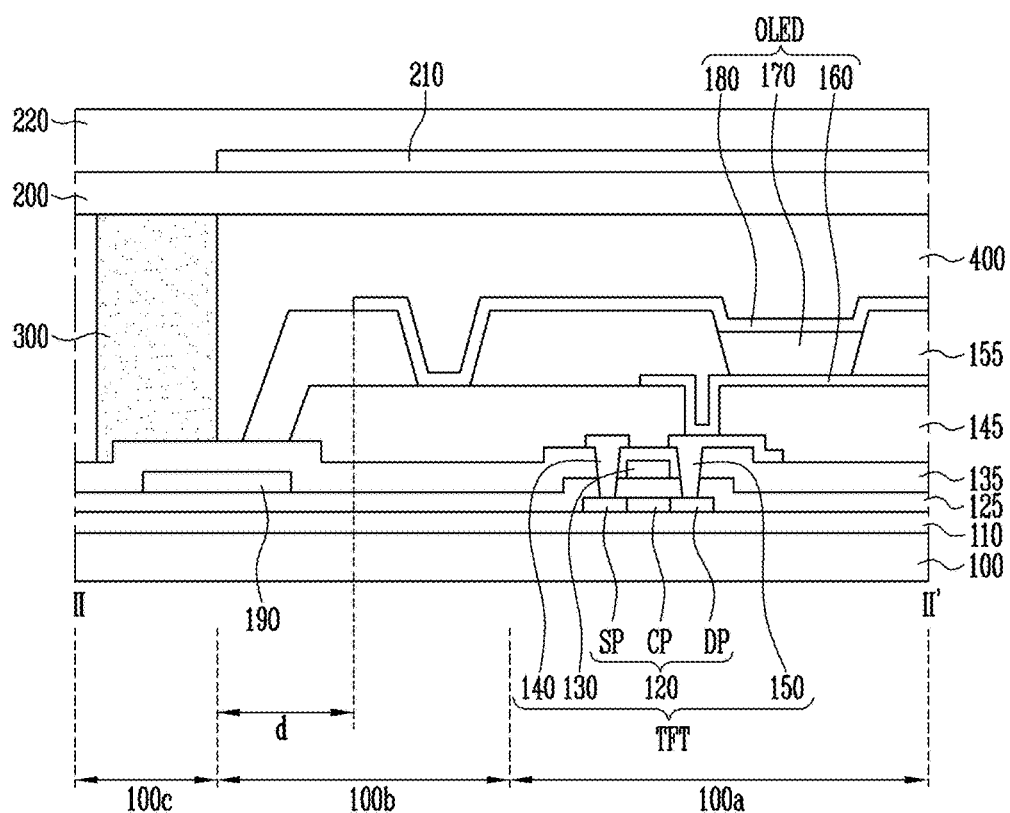
FIG. 4 is a sectional view taken along line II-II' of FIG. 1.

FIG. 3 is a plan view conceptually illustrating a portion corresponding to section P1 of FIG. 1, which illustrates an arrangement relationship among the sealing member, the touch sensing part, and a second electrode. FIG. 4 is a sectional view taken along line II-II' of FIG. 1.

Referring to FIGS. 1, 3, and 4, the display device according to the first embodiment of the present disclosure includes the first substrate 100 and the second substrate 200. Also, the display device further includes the sealing member 300 disposed between the first substrate 100 and the second substrate 200.

The first substrate 100 supports various components to be formed on the first substrate 100. The first substrate 100 is made of an insulating material. For example, the first substrate 100 includes a rigid or flexible substrate, but the present disclosure is not limited thereto. That is, the first substrate 100 may be formed of various materials.

The second substrate 200 may be implemented with the same material as the first substrate 100.

Hereinafter, the display device according to the first embodiment of the present disclosure will be described generally in the stacking order of its layers. For convenience, the first substrate 100 will be first described, and the second substrate 200 will be next described.

A buffer layer 110 is provided on the first substrate 100. The buffer layer 110 prevents impurities from the first substrate 100 from diffusing into upper layers, and improves the flatness of the first substrate 100. The buffer layer 110 may be omitted according to material and process conditions of the first substrate 100.

An active pattern 120 is provided on the buffer layer 110. The active pattern 120 is formed of a semiconductor material. The active pattern 120 includes a source region SP, a drain region DP, and a channel region CP provided between the source region SP and the drain region DP. The active pattern 120 may be doped or undoped silicon, e.g., polysilicon or amorphous silicon. The active pattern 120 may be a semiconductor pattern made of an oxide semiconductor, etc.

A gate insulating layer 125 is provided over the active pattern 120.

A gate electrode 130 is provided on the gate insulating layer 125. The gate electrode 130 may be formed to cover a region corresponding to the channel region CP of the active pattern 120.

An interlayer insulating layer 135 covering the gate electrode 130 is provided over the gate electrode 130. The interlayer insulating layer 135 may include the same material as the gate insulating layer 125. The interlayer insulating layer 135 may insulate the gate electrode 130 from a source electrode 140 and a drain electrode 150, which will be described later.

Openings passing through the gate insulating layer 125 and the interlayer insulating layer 135 expose the source and drain regions SP and DP of the active pattern 120 therethrough.

The source electrode 140 and the drain electrode 150 are provided on the interlayer insulating layer 135. The source electrode 140 and the drain electrode 150 are electrically connected to the respective source and drain regions SP and DP by the openings formed in the gate insulating layer 125 and the interlayer insulating layer 135.

Here, the active pattern 120, the gate electrode 130, the source electrode 140, and the drain electrode 150 constitute a thin film transistor TFT. The structure of the thin film transistor TFT is not necessarily limited thereto however, and the thin film transistor TFT may have various configurations. For example, the thin film transistor TFT may be formed as a top gate type TFT, or may be formed with a bottom gate structure in which the gate electrode 130 is disposed under the active pattern 120.

A protective layer 145 is provided over the source electrode 140 and the drain electrode 150. The protective layer 145 covers the thin film transistor TFT, and may include at least one layer. Also, the protective layer 145 planarizes a surface of the lower structure. The protective layer 145 includes a contact hole through which a portion of the drain electrode 150 is exposed.

An organic light emitting element OLED is provided on the protective layer 145. The organic light emitting element OLED may include a first electrode 160 electrically connected to the drain electrode 150, a light emitting layer 170 disposed on the first electrode 160, and a second electrode 180 disposed on the light emitting layer 170.

One of the first and second electrodes 160 and 180 may be an anode electrode, and the other of the first and second electrodes 160 and 180 may be a cathode electrode. For example, the first electrode 160 may be an anode electrode, and the second electrode 180 may be a cathode electrode. Here, the first electrode 160 may be used as a cathode electrode. However, in the following embodiment, a case where the first electrode 160 is an anode electrode will be described as an example.

The first electrode 160 may be formed of a material having a high work function. In the figures, when images are to be provided toward the lower direction of the first substrate 100, the first electrode 160 may be formed of a transparent conductive layer such as indium tin oxide (ITO), indium zinc oxide (IZO), zinc oxide (ZnO), or indium tin zinc oxide (ITZO). In these figures, when images are to be provided toward the upper direction of the first substrate 100, the first electrode 160 may be formed of a metallic reflective layer such as Ag, Mg, Al, Pt, Pd, Au, Ni, Nd, Ir, or Cr, and a transparent conductive layer such as ITO, IZO, ZnO, or ITZO.

The first electrode 160 may be electrically connected to the drain electrode 150 through the contact hole of the protective layer 145.

A pixel defining layer 155 that defines a pixel region of each pixel PXL may be provided on the first electrodes 160. The pixel defining layer 155 exposes a top or upper surface of the first electrode 160, and protrudes from the first substrate 100 along the circumference of the pixel PXL.

The light emitting layer 170 is provided on the portion of the first electrode 160 exposed by the pixel defining layer 155, and the second electrode 180 is provided on the light emitting layer 170.

An encapsulation layer 400 for covering the second electrode 180 is provided over the second electrode 180. The encapsulation layer 400 may be formed as a single layer. However, the encapsulation layer 400 may also be formed with multiple layers.

The second substrate 200 will now be described, generally in its stacking order.

The second substrate 200 may be made of the same material as the first substrate 100, but the present disclosure is not limited thereto.

A touch sensing part 210 is provided on the second substrate 200. The touch sensing part 210 may include sensing electrodes, and connection lines connected to the sensing electrodes. The sensing electrodes may be arranged on the second substrate 200, in a region corresponding to the first region 100a of the first substrate 100 and part of the second region 100b of the first substrate 100. The connection lines may be arranged on the second substrate 200, in a region corresponding to the second region 100b and/or the third region 100c of the first substrate 100.

A protective film 220 is provided over the touch sensing part 210. The protective film 220 functions to protect the touch sensing part 210 from the outside. The protective film 220 may be configured in the form of a film in which one or more layers of an inorganic material are coated on an organic material, but the present disclosure is not limited thereto.

Referring back to FIGS. 1, 3, and 4, the first substrate 100 including the above-described components may be divided into the first region 100a that is a display region, the second region 100b disposed at the outside of the first region 100a, and the third region 100c surrounding the second region 100b, the third region 100c having the sealing member 300 disposed therein.

A plurality of pixels PXL may be provided in the first region 100a of the first substrate 100. Each of the plurality of pixels PXL may include at least one thin film transistor TFT and an organic light emitting element OLED connected to the thin film transistor TFT as described above. Here, the second electrode 180 of the organic light emitting element OLED may be disposed to extend from the first region 100a of the first substrate 100 to a portion of the second region 100b of the first substrate 100.

A circuit part 190 for driving the thin film transistor TFT and the organic light emitting element OLED may be disposed in the second region 100b of the first substrate 100. The circuit part 190 may include various circuit patterns, e.g., a power line, an anti-electrostatic pattern, and the like. The circuit part 190, as shown in in FIG. 4, may be disposed over both the second region 100b and the third region 100c on the first substrate 100, but the present disclosure is not limited thereto. For example, the circuit part 190 may be disposed in only the second region 100b. In addition, the circuit part 190 may be disposed in only the third region 100c.

The sealing member 300 is provided in the third region 100c of the first substrate 100. The sealing member 300 joins the first substrate 100 and the second substrate 200, to seal the organic light emitting element OLED disposed in the first region 100a. The sealing member 300 is heated by irradiation of a laser beam, to seal the organic light emitting element OLED through a subsequent sealing process in which the sealing member 300 is cured. As an example, the sealing member 300 may include a glass frit, etc.

The touch sensing part 210 may be disposed on the second substrate 200, over the first and second regions 100a and 100b. When viewed in plan view, one end portion of the touch sensing part 210 may overlap one end portion of the sealing member 300 in a region corresponding to the second region 100b, but the present disclosure is not limited thereto. For example, the one end portion of the touch sensing part 210 may be spaced apart from the one end portion of the sealing member 300. In an embodiment of the present disclosure, the touch sensing part 210 and the sealing member 300 may be spaced apart from each other in a region corresponding to the second region 100b of the first substrate 100.

The second electrode 180 may be disposed over the first and second regions 100a and 100b of the first substrate 100. The second electrode 180 and the touch sensing part 210 may partially overlap each other in the second region 100b of the first substrate 100. When viewed in plan view, one end portion of the touch sensing part 210 may extend past the second electrode 180 toward the sealing member 300, in a region corresponding to the second region 100b of the first substrate 100. Therefore, part of the touch sensing part 210 does not overlap the second electrode 180 in the second region 100b, but instead extends beyond it. The touch sensing part 210 and the second electrode 180 may be designed such that the width d of the non-overlapping portion is 80 μm or more.

Meanwhile, the sealing member 300 is formed and cured by irradiation of a laser beam. As described above, the one end portion of the touch sensing part 210 extends further toward the sealing member 300 than the one end portion of the second electrode 180 in the region corresponding to the second region 100b of the first substrate 100, so that it is possible to prevent the second electrode 180 from being exposed to the laser beam when the sealing member 300 is cured. Accordingly, it is possible to prevent the laser beam from propagating to the second electrode 180, thereby preventing deterioration of the light emitting layer 170 disposed under the second electrode 180.

As a result, in the display device according to the first embodiment of the present disclosure, it is possible to prevent the light emitting layer 170 from being deteriorated by the laser beam used in the curing of the sealing member 300, thereby reducing or minimizing defects in the organic light emitting element OLED.

In the display device according to the first embodiment of the present disclosure, the touch sensing part may be provided as below.

Figure 5:
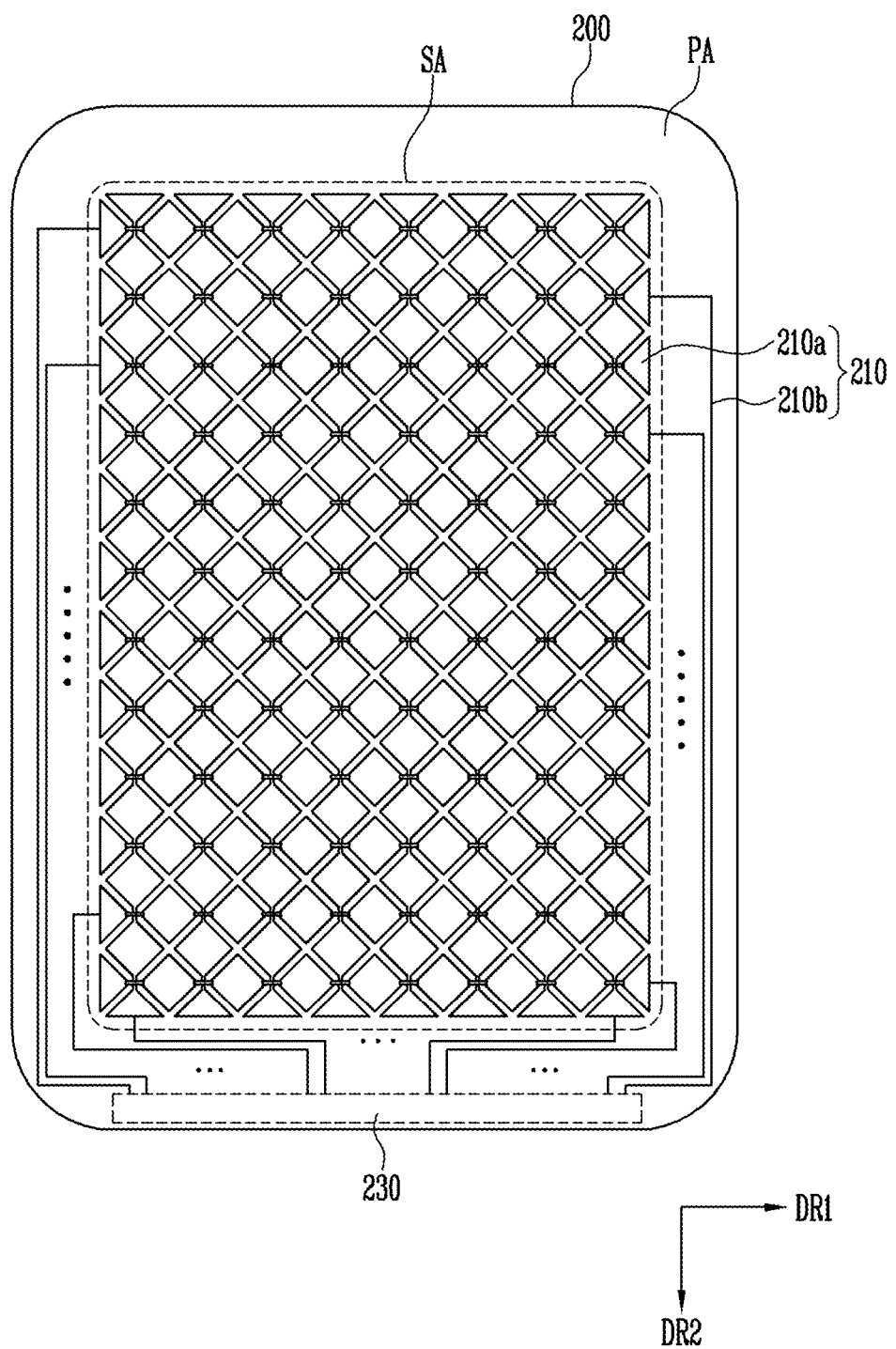
FIG. 5 is a plan view illustrating the touch sensing part of the display device of FIG. 3.

FIG. 5 is a plan view illustrating the touch sensing part of the display device of FIG. 3.

Referring to FIGS. 3 and 5, the touch sensing part 210 is provided on the second substrate 200. The touch sensing part 210 may include sensing electrodes 210a arranged in a sensing region SA, and connection lines 210b arranged in a peripheral region PA surrounding the edge of the sensing region SA. Here, the sensing region SA may correspond to the first region 100a of the first substrate 100. The peripheral region PA may correspond to the second and third regions 100b and 100c of the first substrate 100.

The sensing electrodes 210a may include a plurality of sensing electrode rows arranged to be connected in a first direction DR1, and a plurality of sensing electrode columns arranged to be connected in a second direction DR2 intersecting the first direction DR1. The material, shape, and arrangement structure of the sensing electrodes 210a may have various modified embodiments according to touch sensing schemes of the display device, but the present disclosure is not limited thereto. That is, sensing electrodes 210a of any materials, sizes, shapes, and arrangements are contemplated.

The connection lines 210b connect the sensing electrodes 210a to a driving circuit for driving the touch sensing part 210. The driving circuit may be an external component. The driving circuit may include a position detecting circuit. The connection lines 210b may transmit a sensing input signal from the driving circuit to the sensing electrodes 210a, and/or may transmit a sensing input signal from the sensing electrodes 210a to the driving circuit. The connection lines 210b may be connected to a pad part 230 to be electrically connected to the driving circuit.

In the display device according to the first embodiment of the present disclosure, the pixels may be provided in the following form.

Figure 6:
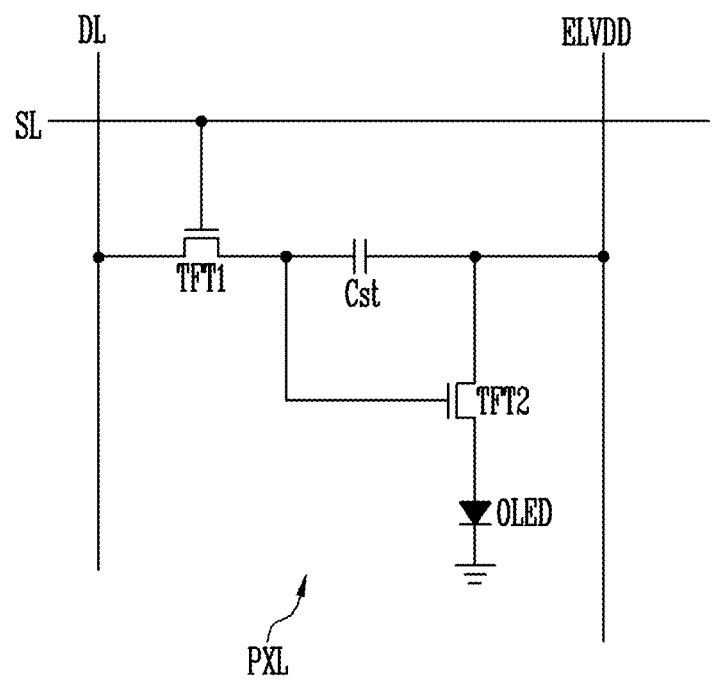
FIG. 6 is a circuit diagram corresponding to a pixel of the display device shown in FIG. 1.
Figure 7:
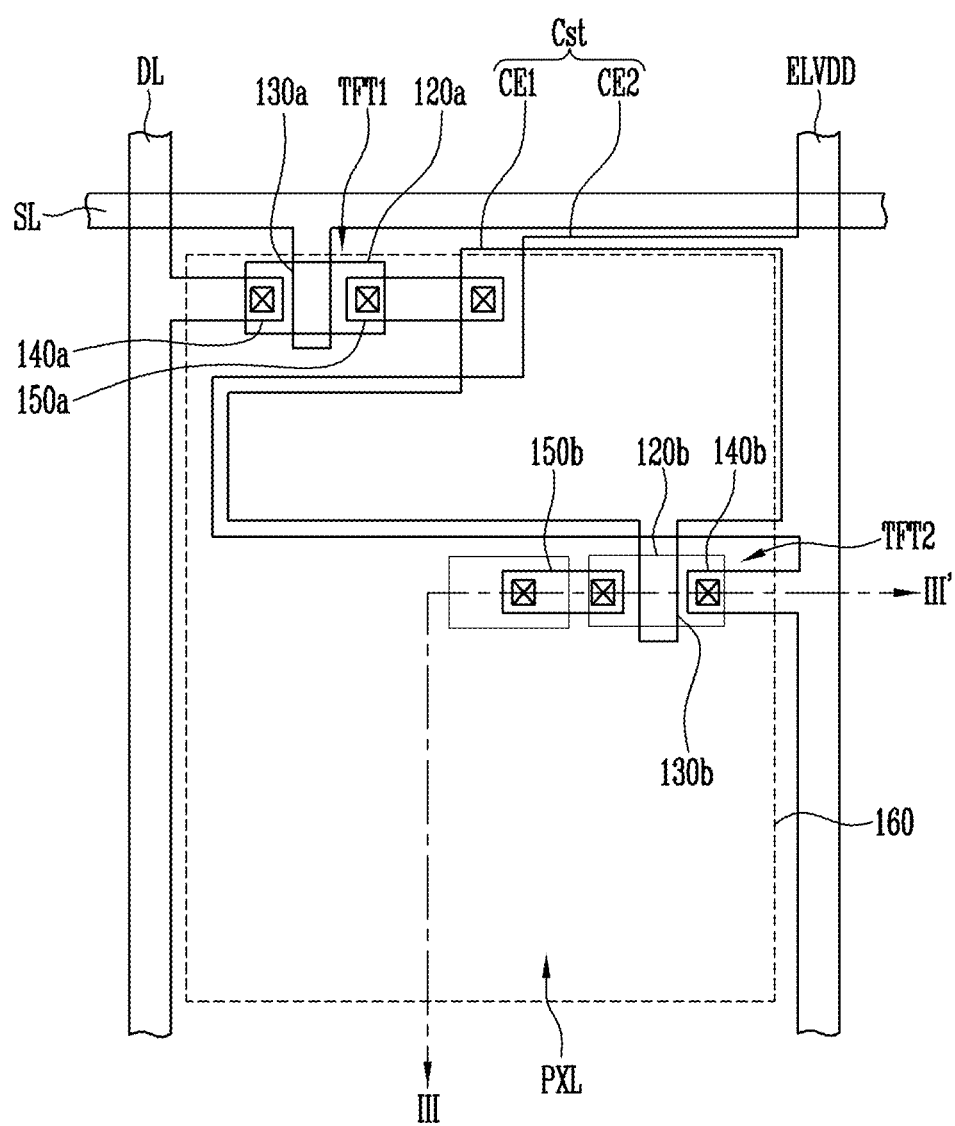
FIG. 7 is a plan view corresponding to the pixel of FIG. 6.
Figure 8:
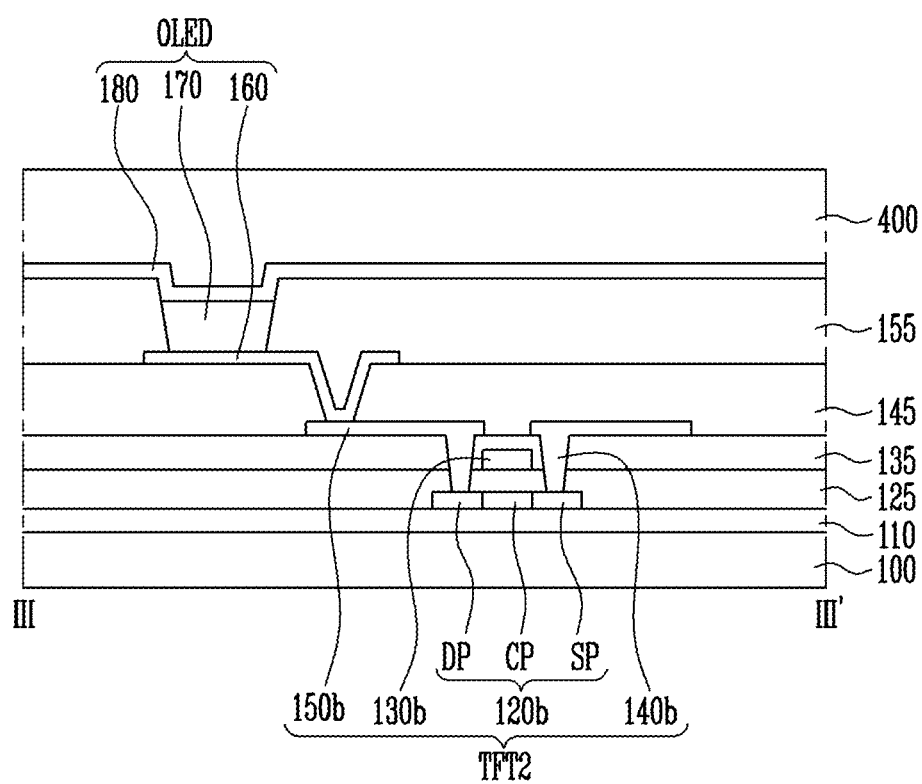
FIG. 8 is a sectional view taken along line III-III' of FIG. 7.

FIG. 6 is a circuit diagram corresponding to a pixel of the display device shown in FIG. 1. FIG. 7 is a plan view corresponding to the pixel of FIG. 6. FIG. 8 is a sectional view taken along line III-III' of FIG. 7.

Referring to FIGS. 1 and 6 to 8, the display device includes a first substrate 100, a line part, and a pixel PXL. The pixel PXL displays an image, and may be provided in plural numbers as described above to be arranged in a matrix form. However, in FIGS. 6 and 7, only one pixel PXL has been illustrated for convenience of description. Here, it has been illustrated that the pixel PXL has a rectangular shape. However, the present disclosure is not limited thereto, and the pixel PXL may be configured in various shapes.

The pixel PXL is provided on the first substrate 100.

The line part provides a signal to the pixel PXL, and includes a scan line SL, a data line DL, and a driving voltage line ELVDD.

The scan line SL extends in one direction. The data line DL extends in another direction intersecting the scan line SL. The driving voltage line ELVDD may extend in substantially the same direction as one of the scan line SL and the data line DL, e.g., the data line DL. In each pixel PXL, scan line SL transmits a scan signal to a thin film transistor, the data line DL transmits a data signal to the thin film transistor, and the driving voltage line ELVDD provides a driving voltage to the thin film transistor.

Each pixel PXL includes the thin film transistor connected to the line part, an organic light emitting element OLED connected to the thin film transistor, and a capacitor Cst.

In more detail, each pixel PXL may include a driving thin film transistor TFT2 for controlling the organic light emitting element OLED, and a switching thin film transistor TFT1 for switching the driving thin film transistor TFT2. In an embodiment of the present disclosure, it is illustrated that one pixel PXL includes two thin film transistors TFT1 and TFT2 and one capacitor Cst, but the present disclosure is not limited thereto.

The switching thin film transistor TFT1 includes a first gate electrode 130a, a first source electrode 140a, and a first drain electrode 150a. The first gate electrode 130a is connected to the scan line SL, and the first source electrode 140a is connected to the data line DL. The first drain electrode 150a is connected to a gate electrode (i.e., a second gate electrode 130b) of the driving thin film transistor TFT2. The switching thin film transistor TFT1 transmits a data signal from the data line DL to the driving thin film transistor TFT2 in response to a scan signal applied to the scan line SL.

The driving thin film transistor TFT2 includes the second gate electrode 130b, a second source electrode 140b, and a second drain electrode 150b. The second gate electrode 130b is connected to the switching thin film transistor TFT1, and the second source electrode 140b is connected to the driving voltage line ELVDD. The second drain electrode 150b is connected to the organic light emitting element OLED.

The switching thin film transistor TFT1 and the driving thin film transistor TFT2 respectively include a first active pattern 120a and a second active pattern 120b, which are formed of a semiconductor material. Each of the first active pattern 120a and the second active pattern 120b includes a source region SP, a drain region DP, and a channel region CP. The first active pattern 120a and the second active pattern 120b may be semiconductor patterns made of poly-silicon, amorphous silicon, oxide semiconductor, etc.

The organic light emitting element OLED includes a light emitting layer 170, and a first electrode 160 and a second electrode 180 which are opposite to each other with the light emitting layer 170 interposed therebetween.

The first electrode 160 is connected to the second drain electrode 150b of the driving thin film transistor TFT2. The first electrode 160 serves as an anode electrode and is an electrode for hole injection. The first electrode 160 may include a material having a high work function.

The light emitting layer 170 emits light based on an output signal of the driving thin film transistor TFT2, so that an image is displayed as the light is emitted or not emitted. Here, the light emitted from the light emitting layer 170 may be changed depending on the material of the light emitting layer 170. The light may be colored light or white light.

The second electrode 180 may include a material having a lower work function than the first electrode 160. For example, the second electrode 180 may include at least one of molybdenum (Mo), tungsten (W), silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), and alloys thereof.

The capacitor Cst is connected between the second gate electrode 130b and the second source electrode 140b of the driving thin film transistor TFT2. The capacitor Cst includes a first capacitor electrode CE1 connected to the first drain electrode 150a of the switching thin film transistor TFT1, and a second capacitor electrode CE2 extending from the driving voltage line ELVDD and located on the first capacitor electrode CE1. The capacitor Cst charges and maintains a data signal input to the second gate electrode 130b of the driving thin film transistor TFT2.

A protective layer 145 is formed over the switching thin film transistor TFT1 and the driving thin film transistor TFT2. The protective layer 145 covers the switching thin film transistor TFT1 and the driving thin film transistor TFT2, and may include at least one layer. The protective layer 145 includes a contact hole through which a portion of the second drain electrode 150b is exposed.

Figure 9:
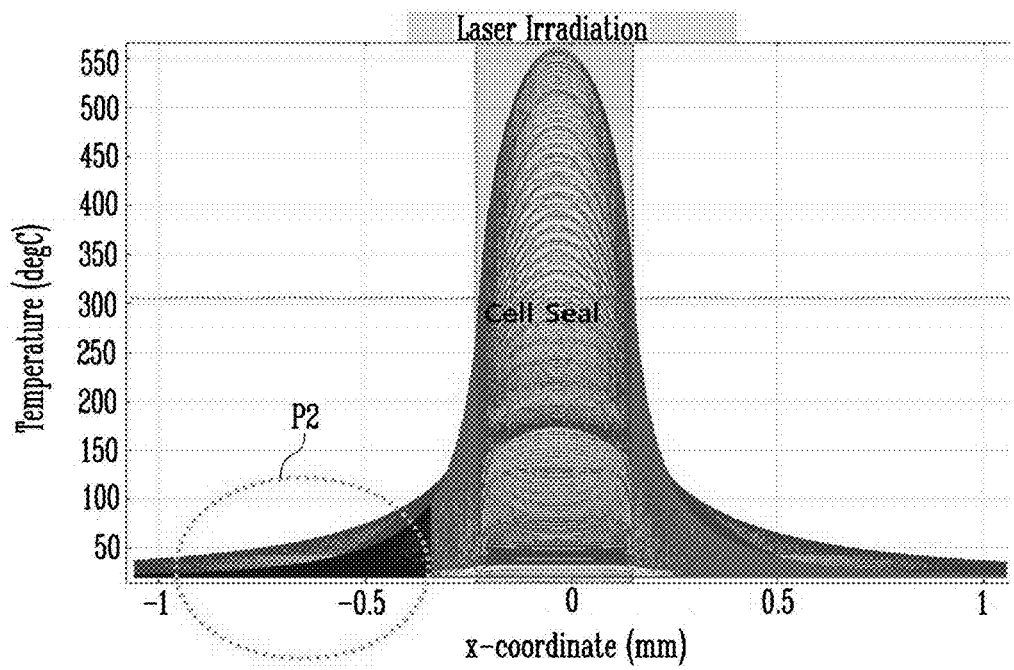
FIG. 9 is a graph illustrating changes in temperature of sealing members, second electrodes, and pixels due to irradiation of a laser beam, for both an existing display device and a display device according to the first embodiment of the present disclosure.
Figure 10:
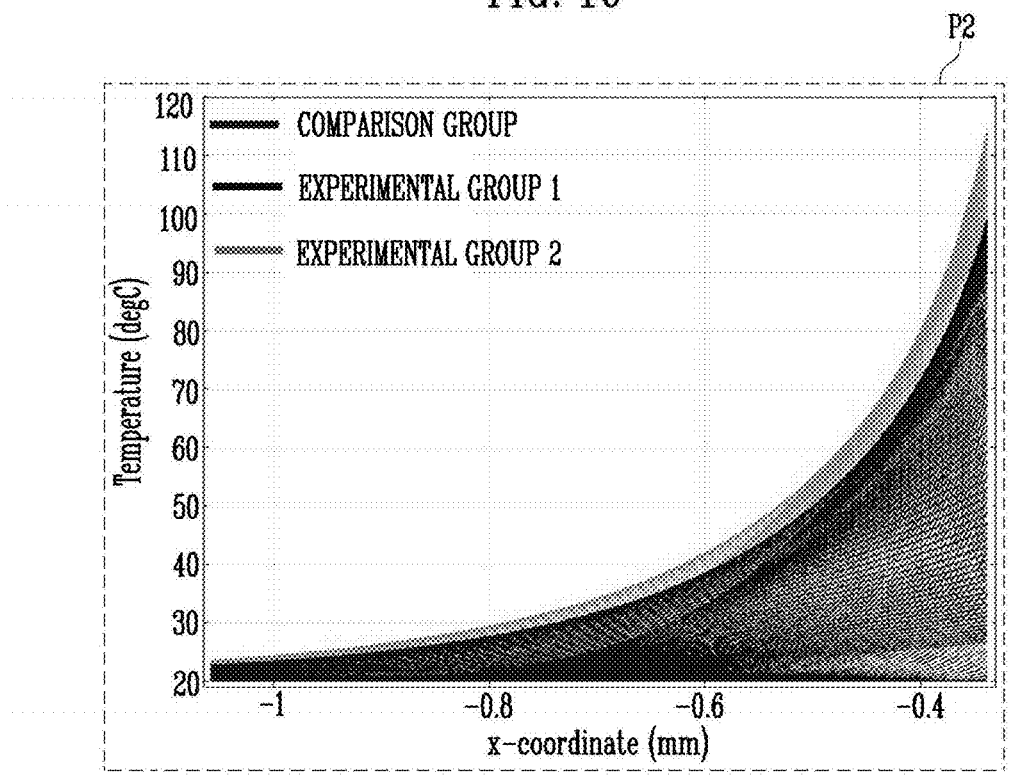
FIG. 10 is an enlarged graph of a portion corresponding to section P2 of FIG. 9.

FIG. 9 is a graph illustrating changes in temperature of sealing members, second electrodes, and pixels due to irradiation of a laser beam, for both a conventional display device and a display device according to the first embodiment of the present disclosure. FIG. 10 is an enlarged graph of a portion corresponding to P2 of FIG. 9.

In the graphs of FIGS. 9 and 10, the X-axis respectively represents a distance between a sealing member and a second electrode and a distance between the sealing member and a pixel. In the graph, the Y-axis represents values obtained by measuring surface temperatures of the sealing member, the second electrode, and the pixel resulting from irradiation of a laser beam onto the sealing member. The sealing member onto which the laser beam is directly irradiated may be located at the center of the X-axis of the graph. In addition, the left side of the X-axis of the graph represents a distance between the sealing member and the second electrode, and the right side of the X-axis of the graph represents a distance between the sealing member and the pixel.

In FIG. 10, the portion designated as Comparison Group represents measurements taken from a conventional display device, and the portion designated as Experimental Group 1 represents measurement values taken from a display device according to the first embodiment of the present disclosure. Also, in FIG. 10, the portion designated as Experimental Group 2 represents measurement values taken from a display device having the second electrode formed to have a thicker thickness than the second electrode included in the display device of Experimental Group 1.

It can be seen that, when the laser beam is irradiated onto the sealing member, the surface temperature of the second electrode decreases as the distance between the sealing member and the second electrode increases. In addition, it can be seen that, when the laser beam is irradiated onto the sealing member, the surface temperature of the pixel decreases as the distance between the sealing member and the pixel increases.

In each of Experimental Groups 1 and 2, it can be seen that the surface temperature of the second electrode increases as compared with the Comparison Group. This is because the display device of Experimental Group 1 and the display device of Experimental Group 2 are configured to minimize dead spaces, so that the distance between the sealing member and the second electrode is narrow as compared with the Comparison Group.

Meanwhile, the light emitting layer of the organic light emitting element included in the display device may be degraded and damaged at a temperature of about 300° C.

In each of the Comparison Group, Experimental Group 1, and Experimental Group 2, as the second electrode comes close to the sealing member, the surface temperature of the second electrode increases due to the laser beam being irradiated onto the sealing member. However, the surface temperature of the second electrode does not reach the temperature (about 300° C.) at which the light emitting layer is damaged.

As described above, it has been observed that the surface temperatures of all of the second electrodes of the Comparison Group, Experimental Group 1, and Experimental Group 2 increase due to the laser beam being irradiated onto the sealing member in the curing of the sealing member. However, it has been observed that the surface temperature of the second electrode included in each of the Comparison Group, Experimental Group 1, and Experimental Group 2 does not increase to a temperature high enough to damage the light emitting layer disposed under the second electrode.

Consequently, in the display device according to the first embodiment of the present disclosure, the touch sensing part prevents the second electrode from being exposed to the laser beam, even though dead space is reduced by extending the second electrode in the direction toward the sealing member. Accordingly, it is possible to prevent degradation of the light emitting layer.

FIGS. 11 to 14 are sectional views sequentially illustrating a fabrication method for the display device of FIG. 4.

Figure 11:
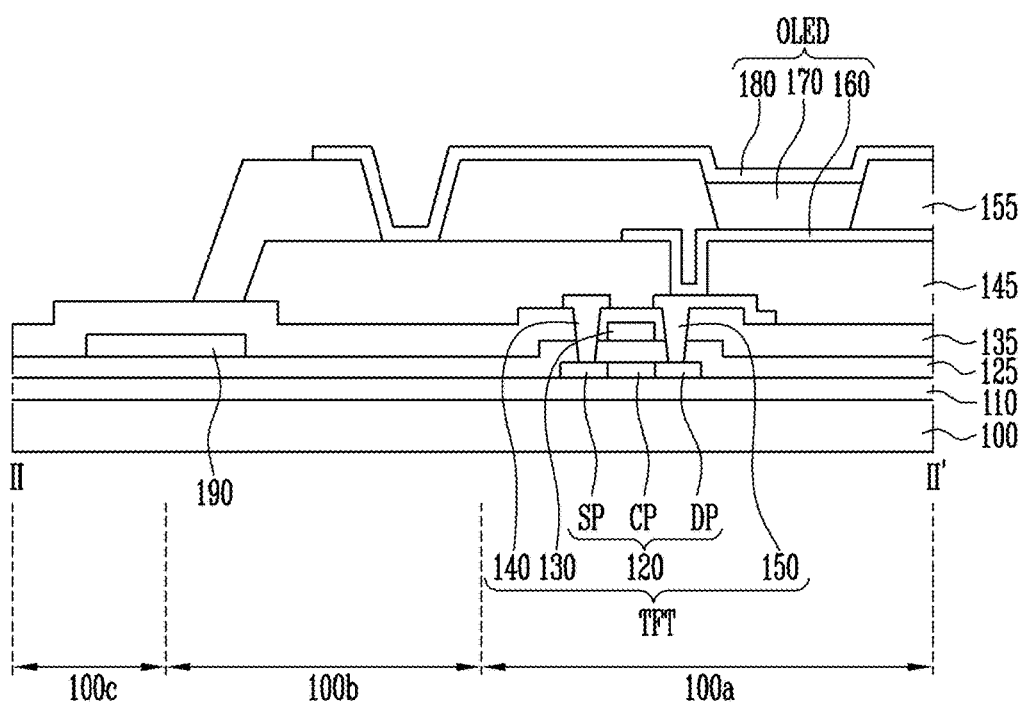
FIGS. 11 to 14 are sectional views sequentially illustrating a fabrication method for the display device of FIG. 4.

Referring to FIGS. 4 and 11, a thin film transistor TFT and an organic light emitting element OLED connected to the thin film transistor TFT are formed in a first region 100a of a first substrate 100. In addition, a circuit part 190 is formed in a second region 100b of the first substrate 100. Here, the circuit part 190 may be provided on the first substrate 100, extending from the second region 100b to a portion of a third region 100c of the first substrate 100.

Figure 12:
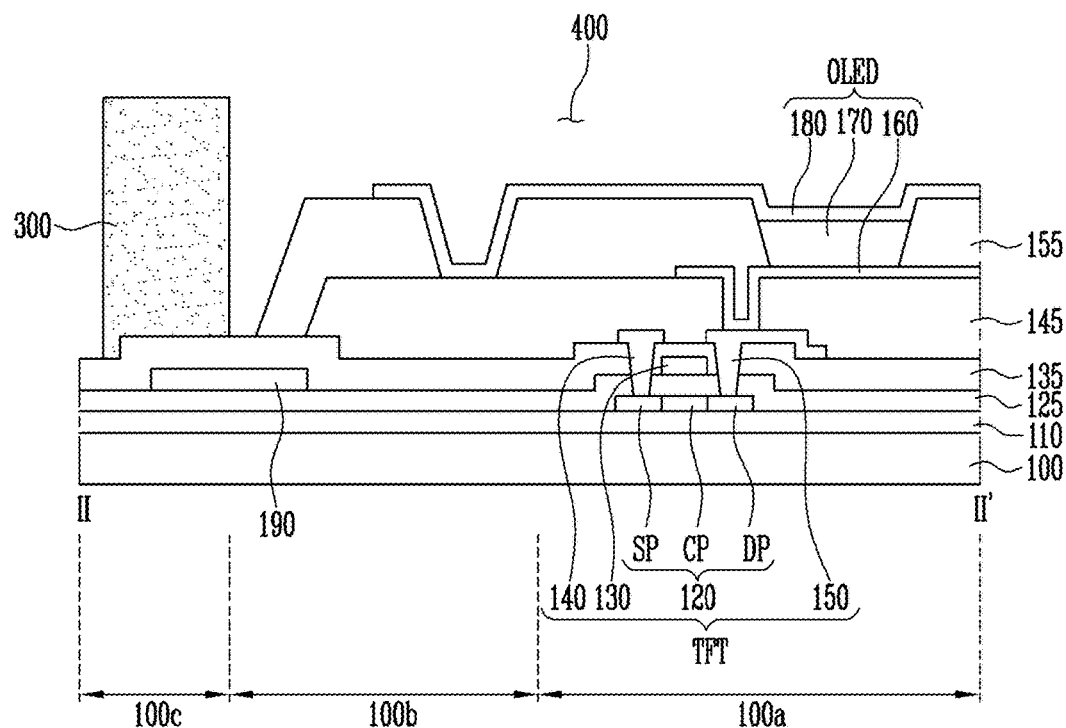

Referring to FIG. 12, an encapsulation layer 400 for covering the thin film transistor TFT and the organic light emitting element OLED is formed over the first and second regions 100a and 100b of the first substrate 100.

In addition, a sealing member 300 is formed in the third region 100c of the first substrate 100. The sealing member 300 joins the first substrate 100 to a second substrate provided in a subsequent process, to seal the organic light emitting element OLED inside the first region 100a. The sealing member 300 is heated by irradiation of a laser beam, to seal the organic light emitting element OLED through a subsequent sealing process in which the sealing member 300 is cured. For example, the sealing member 300 may include a glass frit, etc.

Figure 13:
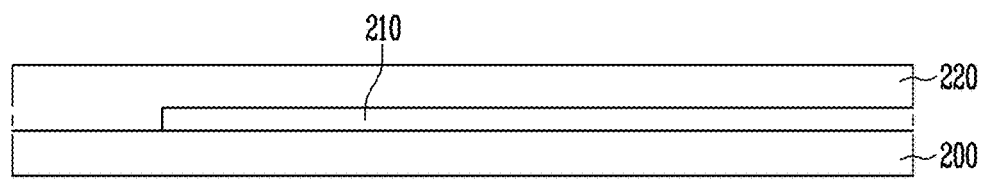

Referring to FIG. 13, a second substrate 200 is prepared. The second substrate 200 may include a material substantially identical or similar to that of the first substrate (100 of FIG. 12). The second substrate 200 may serve as a sealing substrate for sealing the organic light emitting element (OLED of FIG. 12) disposed on the first substrate 100.

After that, a touch sensing part 210 is formed on the second substrate 200. The touch sensing part 210 may be disposed on the second substrate 200 to extend from the second region 100b to the first region 100a of the first substrate 100.

Subsequently, a protective film 220 is formed over the touch sensing part 210.

Figure 14:
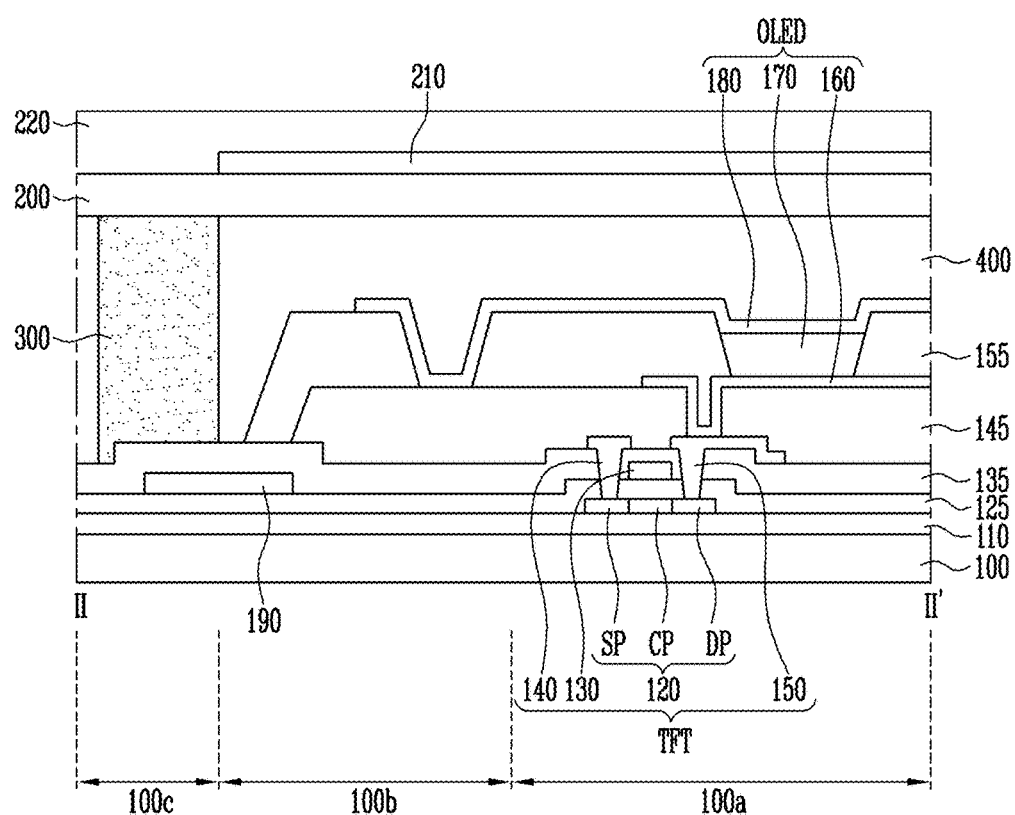

The second substrate 200 is then disposed to be opposite to the first substrate 100, and a laser beam is irradiated onto the sealing member 300, so that the first and second substrates 100 and 200 can be joined together as shown in FIG. 14.

Figure 15:
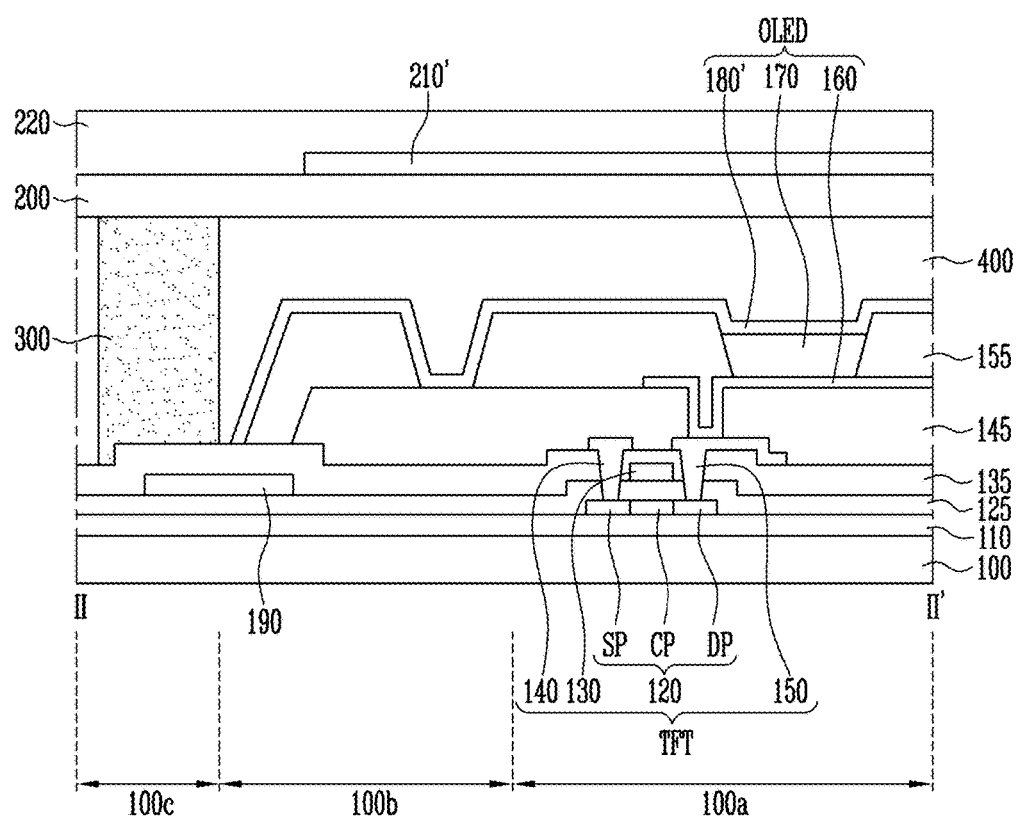
FIG. 15 is a sectional view illustrating a display device according to a second embodiment of the present disclosure.

FIG. 15 is a sectional view illustrating a display device according to a second embodiment of the present disclosure. In the display device according to the second embodiment of the present disclosure, differences from the display device according to the already-described embodiments will be mainly described, to avoid redundancy. Portions not particularly described in the second embodiment of the present disclosure follow those of the display device according to the above-described embodiment. Identical reference numerals designate identical components, and similar reference numerals designate similar components.

Referring to FIG. 15, the display device according to the second embodiment of the present disclosure includes a first substrate 100 and a second substrate 200, which are opposite to each other. Also, the display device further includes a sealing member 300 disposed between the first and second substrates 100 and 200.

Similar to previous embodiments, the first substrate 100 may be divided into a first region 100a that is a display region, a second region 100b disposed at the outside of the first region 100a, and a third region 100c surrounding the second region 100b, the third region 100c having the sealing member 300 disposed therein.

At least one thin film transistor TFT and an organic light emitting element OLED connected to the thin film transistor TFT may be disposed in the first region 100a of the first substrate 100.

The organic light emitting element OLED may include a first electrode 160 electrically connected to the thin film transistor TFT, a light emitting layer 170 disposed on the first electrode 160, and a second electrode 180' disposed on the light emitting layer 170.

The second electrode 180' may be disposed to extend from the first area 100a to the second area 100b of the first substrate 100. Specifically, the second electrode 180' may extend from the first area 100a to the second area 100b to come close to one end portion of the sealing member 300 when viewed in plan view. Here, the second electrode 180' may include an opaque conductive material having a lower work function than the first electrode 160. Particularly, the second electrode 180' may be made of a thick opaque conductive material having at least a predetermined thickness, to facilitate the movement of electrons to the light emitting layer 170.

The second substrate 200 includes a touch sensing part 210' that recognizes a touch event of the display device, and a protective film 220 that covers the touch sensing part 210'.

The touch sensing part 210' may include sensing electrodes and connection lines connected to the sensing electrodes. Here, the sensing electrodes may be made of a transparent conductive material. The transparent conductive material may include indium tin oxide (ITO), indium zinc oxide (IZO), antimony zinc oxide (AZO), indium tin zinc oxide (ITZO), zinc oxide (ZnO), tin oxide ($SnO_2$), carbon nano tube, graphene, and the like. The sensing electrodes may be formed in a single layer or multiple layers. In this case, the sensing electrodes may include a multi-layered structure in which two or more materials from among the above-described materials are stacked.

The touch sensing part 210' may be disposed on the second substrate 200, over a region corresponding to the first and second regions 100a and 100b of the first substrate 100. When viewed in plan view, the touch sensing part 210' may be disposed in a region corresponding to the second region 100b of the first substrate 100 such that one end portion of the touch sensing part 210' is located inward of one end portion the sealing member 300.

When viewed in plan view, one end portion of the second electrode 180' may be disposed outward of the one end portion of the touch sensing part 210' in the second region 100b of the first substrate 100. Therefore, a non-overlapping portion at which the second electrode 180' and the touch sensing part 210' do not overlap with each other may be provided in the region corresponding to the second region 100b of the first substrate 100. That is, the second electrode 180' and the touch sensing part 210' may only partially overlap each other in the region corresponding to the second region 100b of the first substrate 100.

Meanwhile, the sealing member 300 is formed as it is cured by irradiation of a laser beam. As described above, the one end portion of the second electrode 180' extends closer to the sealing member 300 than the one end portion of the touch sensing part 210', and therefore, the second electrode 180' may be exposed to the laser beam when the sealing member 300 is cured. When the laser beam is irradiated onto the second electrode 180', the opaque material of the second electrode 180' may reflect the laser beam up toward the touch sensing part 210'. The touch sensing part 210', made of transparent conductive material, may allow the laser beam reflected by the second electrode 180' to be transmitted to the outside. Thus, it is possible to prevent the laser beam from being again incident onto the second electrode 180'. Accordingly, it is possible to prevent degradation of the light emitting layer 170 disposed under the second electrode 180' in the first region 100a of the first substrate 100.

Consequently, in the display device according to the second embodiment of the present disclosure, it is possible to prevent degradation of the light emitting layer 170 due to the laser beam used in the curing of the sealing member 300, thereby minimizing defects in the organic light emitting element OLED.

Figure 16:
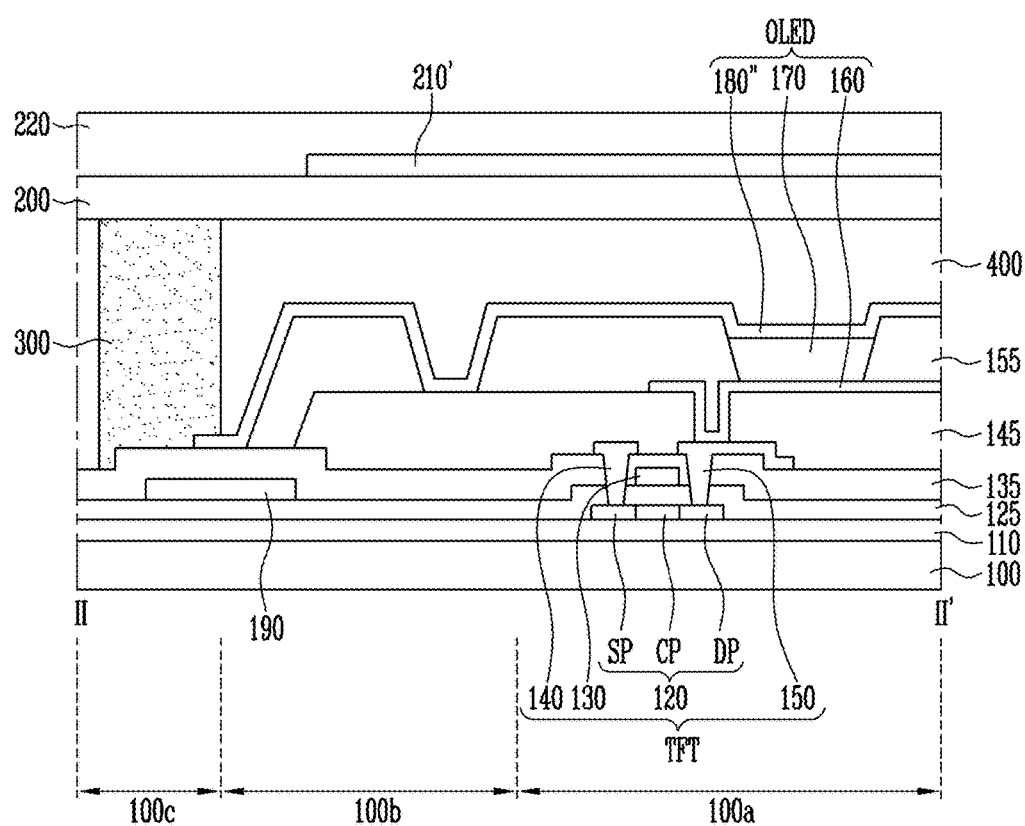
FIG. 16 is a sectional view illustrating a display device according to a third embodiment of the present disclosure.

FIG. 16 is a sectional view illustrating a display device according to a third embodiment of the present disclosure. In the display device according to the third embodiment of the present disclosure, differences from the display devices of previous embodiments will be mainly described, to avoid redundancy. Portions not particularly described in the third embodiment of the present disclosure follow those of the display devices according to the above-described embodiments. Identical reference numerals designate identical components, and similar reference numerals designate similar components.

Referring to FIG. 16, the display device according to the third embodiment of the present disclosure includes a first substrate 100 and a second substrate 200, which are opposite to each other. Also, the display device further includes a sealing member 300 disposed between the first and second substrates 100 and 200.

The first substrate 100 may be divided into a first region 100a that is a display region, a second region 100b disposed at the outside of the first region 100a, and a third region 100c surrounding the second region 100b, the third region 100c having the sealing member 300 disposed therein.

At least one thin film transistor TFT and an organic light emitting element OLED connected to the thin film transistor TFT may be disposed in the first region 100a of the first substrate 100.

A second electrode 180" included in the organic light emitting element OLED may be disposed to extend from the first region 100a to the third region 100c of the first substrate 100. Specifically, the second electrode 180" may extend from the first region 100a to the third region 100c to overlap the sealing member 300 when viewed in plan view.

The second substrate 200 includes a touch sensing part 210' that recognizes a touch event of the display device, and a protective film 220 that covers the touch sensing part 210'.

The touch sensing part 210' may be disposed on the second substrate 200, over a region corresponding to the first and second regions 100a and 100b of the first substrate 100. When viewed in plan view, the touch sensing part 210' may be disposed in a region corresponding to the second region 100b of the first substrate 100 such that one end portion of the touch sensing part 210' is located inward of one end portion the sealing member 300.

When viewed in plan view, one end portion of the second electrode 180" may be disposed outward of the one end portion of the touch sensing part 210' in the second region 100b of the first substrate 100. Therefore, a non-overlapping portion at which the second electrode 180" and the touch sensing part 210' do not overlap with each other may be provided in the region corresponding to the second region 100b of the first substrate 100. That is, the second electrode 180" and the touch sensing part 210' may only partially overlap each other in the region corresponding to the second region 100b of the first substrate 100, with the second electrode 180" extending beyond the touch sensing part 210' in plan view.

Meanwhile, the sealing member 300 is formed as it is cured by irradiation of a laser beam.

As described above, the one end portion of the second electrode 180" extends closer to the sealing member 300 than the one end portion of the touch sensing part 210' in the second region 100b of the first substrate 100, and therefore, the second electrode 180" may be exposed to the laser beam when the sealing member 300 is cured.

When the laser beam is irradiated onto the second electrode 180", the second electrode 180", being opaque, may reflect the laser beam back toward the touch sensing part 210'. The touch sensing part 210', being transparent, may allow the laser beam reflected by the second electrode 180" to be transmitted to the outside. Thus, it is possible to prevent the laser beam from being again incident to the second electrode 180". Accordingly, it is possible to prevent degradation of the light emitting layer 170 disposed under the second electrode 180" in the first region 100a of the first substrate 100.

According to the present disclosure, it is possible to provide a display device that minimizes a defect of a display device.

According to the present disclosure, it is possible to provide a method for fabricating the display device.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims. Various features of the above described and other embodiments can be mixed and matched in any manner, to produce further embodiments consistent with the invention.

What is claimed is:

1. A display device comprising:
a first substrate including a first region, a third region spaced apart from and surrounding the first region, and a second region located between the first region and the third region; a second substrate opposite to the first substrate;
a display element including a first electrode provided on the first substrate, a light emitting layer provided on the first electrode, and a second electrode provided on the light emitting layer;
a touch sensing part disposed on the second substrate; and
a sealing member provided on the third region of the first substrate, the sealing member joining the first substrate and the second substrate, wherein the second electrode overlaps with the touch sensing part when viewed perpendicularly to a major surface of the first substrate, and an end of the second electrode is spaced apart from an end of the touch sensing part in a direction of the sealing member in the second region,
wherein the end of the second electrode is disposed closer to the first region of the first substrate than the end of the touch sensing part, and
wherein the end of the second electrode and the end of the touch sensing part are located in a non-display region of the second region.

2. The display device of claim 1, wherein the second electrode is disposed on the first region and the second region, and does not overlap the sealing member.

3. The display device of claim 2, wherein the touch sensing part is disposed in the first region and the second region, and does not overlap with the sealing member.

4. The display device of claim 3, wherein the second region includes a non-overlapping portion at which the second electrode and the touch sensing part do not overlap each other.

5. The display device of claim 4, wherein a width of the non-overlapping portion is at least 80 μm.

6. The display device of claim 1, wherein the touch sensing part includes touch sensing electrodes that are provided on the second substrate and sense a touch, and connection lines connected to the touch sensing electrode.

7. The display device of claim 6, wherein the touch sensing electrodes are disposed in a region corresponding to the first region of the first substrate on the second substrate, and the connection lines are disposed in a region corresponding to any one of the second and third regions of the first substrate on the second substrate.

8. The display device of claim 7, further comprising a protective film provided on the touch sensing part.

9. The display device of claim 1, wherein the first substrate further includes at least one thin film transistor connected to the display element to drive the display element.

10. The display device of claim 9, wherein the thin film transistor includes: an active pattern provided on the first substrate; a gate electrode provided on the active pattern with a gate insulating layer interposed therebetween; and source and drain electrodes each connected to the active pattern, wherein any one of the source and drain electrodes is electrically connected to the first electrode.

11. A display device comprising:
a first substrate including a first region in which an image is displayed, a second region provided at the periphery of the first region, and a third region provided at the periphery of the second region;
a second substrate provided on the first substrate;

a plurality of pixels displaying the image, the plurality of pixels each including at least one thin film transistor and a light emitting device connected to the thin film transistor;

a touch sensing part provided on the second substrate; and a sealing member provided in the third region, the sealing member joining the first substrate and the second substrate, wherein the light emitting device includes a first electrode provided on the first substrate, a light emitting layer provided on the first electrode, and a second electrode provided on the light emitting layer, wherein the second electrode overlaps with the touch sensing part when viewed perpendicularly to a major surface of the first substrate, and an end of the second electrode is spaced apart from an end of the touch sensing part in a direction of the sealing member in the second region, wherein the end of the second electrode is disposed closer to the first region of the first substrate than the end of the touch sensing part, and wherein the end of the second electrode and the end of the touch sensing part are located in a non-display region of the second region.

12. The display device of claim 11, wherein the second electrode is disposed in the first region and the second region, and does not overlap with the sealing member.

* * * * *